US012805318B2

(12) United States Patent
Yuki et al.

(10) Patent No.: US 12,805,318 B2
(45) Date of Patent: Nov. 17, 2026

(54) INSULATING SUBSTRATE AND MANUFACTURING METHOD THEREOF

(71) Applicant: DOWA METALTECH CO., LTD., Tokyo (JP)

(72) Inventors: Seiya Yuki, Nagano (JP); Takashi Ideno, Nagano (JP); Eitarou Satou, Nagano (JP); Yukihiro Kitamura, Nagano (JP)

(73) Assignee: DOWA METALTECH CO., LTD., Tokyo (JP)

( * ) Notice: Subject to any disclaimer, the term of this patent is extended or adjusted under 35 U.S.C. 154(b) by 70 days.

(21) Appl. No.: 18/009,880

(22) PCT Filed: Jun. 29, 2021

(86) PCT No.: PCT/JP2021/024583

§ 371 (c)(1),
(2) Date: Dec. 12, 2022

(87) PCT Pub. No.: WO2022/014318

PCT Pub. Date: Jan. 20, 2022

(65) Prior Publication Data

US 2023/0298961 A1 Sep. 21, 2023

(30) Foreign Application Priority Data

Jul. 15, 2020 (JP) ................................ 2020-121481

(51) Int. Cl.
*H01L 23/373* (2006.01)
*H10W 40/00* (2026.01)
*H10W 40/25* (2026.01)

(52) U.S. Cl.
CPC ....... *H10W 40/255* (2026.01); *H10W 40/037* (2026.01)

(58) Field of Classification Search
CPC ........................ H01L 21/4882; H01L 23/3735
See application file for complete search history.

(56) References Cited

U.S. PATENT DOCUMENTS

2009/0097220 A1* 4/2009 Lee .................. H01L 23/49816 361/774
2015/0348934 A1* 12/2015 Qin ....................... H01L 23/142 438/113

(Continued)

FOREIGN PATENT DOCUMENTS

CN 107408538 11/2017
CN 107851617 3/2018

(Continued)

OTHER PUBLICATIONS

JP2006351988A mt (Year: 2006).*

(Continued)

*Primary Examiner* — Gordon A Jones
(74) *Attorney, Agent, or Firm* — GREENBLUM & BERNSTEIN, P.L.C.

(57) ABSTRACT

An insulating substrate in which one principal surface of a heat-dissipation-side metal plate is bonded to one principal surface of a ceramic substrate via a brazing material layer provided therebetween, and a solder resist portion is formed on at least one selected from a periphery of the other principal surface of the heat-dissipation-side metal plate, a side surface of the heat-dissipation-side metal plate, and a surface of the brazing material layer. A solder resist prevents solder from wrapping around the brazing material layer, and thereby, what is called “the brazing material layer leaching into solder” no longer occurs and the occurrence of cracks inside the brazing material layer is avoided. This prevents stress concentration from occurring in the ceramic substrate at an inner portion relative to an end portion of the heat-dissipation-side metal plate.

9 Claims, 3 Drawing Sheets

(56) References Cited

U.S. PATENT DOCUMENTS

| | | | | |
|---|---|---|---|---|
| 2018/0190568 | A1* | 7/2018 | Naba | C04B 37/026 |
| 2019/0126374 | A1* | 5/2019 | Kawamura | H01L 25/18 |
| 2020/0098660 | A1* | 3/2020 | Wakaiki | H01L 21/4882 |
| 2020/0294953 | A1* | 9/2020 | Yamada | H01L 21/56 |
| 2022/0020740 | A1* | 1/2022 | Maldo | H01L 23/13 |
| 2022/0262632 | A1* | 8/2022 | Yahata | H01L 21/68742 |

FOREIGN PATENT DOCUMENTS

| | | | | |
|---|---|---|---|---|
| EP | 3321957 | | | 5/2018 |
| EP | 3370488 | | | 9/2018 |
| JP | 9-17918 | | | 1/1997 |
| JP | 10-125821 | A | | 5/1998 |
| JP | 2005-268821 | | | 9/2005 |
| JP | 2006-228918 | | | 8/2006 |
| JP | 2006-351988 | A | | 12/2006 |
| JP | 2009-70863 | A | | 4/2009 |
| JP | 2009170930 | A | * | 7/2009 |
| JP | 2010-241627 | A | | 10/2010 |
| JP | 2011-181634 | | | 9/2011 |
| JP | 2012-142521 | A | | 7/2012 |
| JP | 2012146813 | | | 8/2012 |
| JP | 2013-211546 | A | | 10/2013 |
| JP | 2014-60216 | A | | 4/2014 |
| JP | 2016-165001 | | | 9/2016 |
| JP | 2019-207897 | | | 12/2019 |
| WO | 2014/006724 | | | 1/2014 |

OTHER PUBLICATIONS

JP2009170930A mt (Year: 2009).*

Extended European Search Report issued in European patent application No. 21842432.3, dated Jun. 11, 2024.

Extended European Search Report issued in European patent application No. 21842920.7, dated Jun. 21, 2024.

International Search Report issued in International Bureau of WIPO Patent Application No. PCT/JP2021/024583, dated Sep. 7, 2021, along with an English translation thereof.

Japanese Office Action issued in JP 2020-121481, dated Dec. 17, 2024, along with a machine English translation thereof.

China Office Action issued in CN 202180048697.8, dated Aug. 20, 2025, along with English translation thereof.

China Office Action issued in CN 202180048697.8, dated Dec. 30, 2025, along with English translation thereof.

* cited by examiner

INSULATING SUBSTRATE AND MANUFACTURING METHOD THEREOF

TECHNICAL FIELD

The present invention relates to an insulating substrate to be used for a semiconductor power module, and the like, and a manufacturing method thereof.

BACKGROUND ART

For example, as described in Patent Document 1, an insulating substrate used for a semiconductor power module, and the like is configured in which a circuit-side metal plate and a heat-dissipation-side metal plate are brazed to both surfaces of a ceramic substrate made of AlN, $Al_2O_3$, $Si_3N_4$, or the like with a brazing material layer, respectively. Then, a semiconductor chip is soldered to the circuit-side metal plate and a Cu or Al-based heat sink plate having excellent thermal conductivity is soldered to the heat-dissipation-side metal plate to fabricate a semiconductor power module or the like. Further, as described in Patent Document 2, as the insulating substrate, there is generally used a metal-ceramic insulating substrate in which a metal plate is bonded to a ceramic substrate using a brazing material containing Ag and Cu and an active metal.

In order to inhibit the occurrence of cracks in the ceramic substrate due to a heat cycle load in such an insulating substrate, Patent Document 3 describes a technique to prevent the occurrence of cracks by oxidizing a copper plate before bonding of a semiconductor chip or a heat sink plate. Further, Patent Document 4 describes a substrate for a power module with a heat sink, which has a low initial thermal resistance, inhibits the occurrence of cracks in a ceramic substrate under a heat cycle load, and is capable of inhibiting the increase in thermal resistance. Further, Patent Document 5 describes a technique to improve heat cycle characteristics by forming steps at end portions of a copper plate.

PRIOR ART DOCUMENT

Patent Document

Patent Document 1: Japanese Laid-open Patent Publication No. 2009-70863

Patent Document 2: Japanese Laid-open Patent Publication No. 2010-241627

Patent Document 3: Japanese Laid-open Patent Publication No. 2013-211546

Patent Document 4: Japanese Laid-open Patent Publication No. 2014-60216

Patent Document 5: Japanese Laid-open Patent Publication No. H10-125821

DISCLOSURE OF THE INVENTION

Problems to be Solved by the Invention

In a conventional insulating substrate in which a metal plate such as a Cu plate and a ceramic substrate such as an AlN substrate are bonded together, a circuit-side metal plate (circuit pattern) is formed on one surface of the ceramic substrate and a heat-dissipation-side metal plate is formed on the other surface of the ceramic substrate. When the aforementioned insulating substrate is used as a substrate for a power module, electronic components such as semiconductor chips and terminals are bonded to the surface of the aforementioned circuit-side metal plate by soldering or the like, and a relatively thick (for example, about 2 to 5 mm) plate-shaped heat sink plate (base plate) made of Cu, for example, is bonded to the aforementioned heat-dissipation-side metal plate by soldering. After bonding and wiring of power semiconductors and other components are completed, a resin case is formed on the heat sink plate so as to surround the insulating substrate, the case is filled with a gel material for sealing, processes such as closing a lid of the case are performed, and then a power module is manufactured.

In recent years, there has been an increasing demand for the insulating substrate to improve severe heat cycle characteristics at a higher temperature both in the insulating substrate alone and in a state of the heat sink plate being soldered to the insulating substrate. However, the ceramic insulating substrate in Patent Document 1 is not sufficient in the heat cycle characteristics of the insulating substrate alone, and cracks may occur in the ceramic substrate after a heat cycle test. Although the insulating substrates in Patent Documents 2, 3, and 5 have excellent heat cycle characteristics as the insulating substrate alone, it has been found out that cracks occur in the ceramic substrate when a high-temperature heat cycle test is conducted with the heat sink plate soldered to the heat-dissipation-side metal plate (metal plate for forming heat sink plate) of the insulating substrate. In Patent Document 4, a metal layer of Cu or a Cu alloy and a heat sink are solid-phase diffusion bonded with a bonding material formed of Al or an Al alloy, but as compared to soldering bonding, large bonding defects are likely to occur between the two, it is difficult to control them, and cracks may occur in a bonding portion in a high-temperature heat cycle test.

The high-temperature heat cycle characteristics are characteristics that have been required in recent years due to the use of SiC semiconductor chips that operate at high temperatures, the use of lead-less solder to increase the soldering temperature, or other reasons, and for example, a heat cycle test with a heating temperature on a high-temperature side of 150° C. or more is required not to cause cracks to occur in the ceramic substrate after the heat cycle test with a predetermined number of cycles.

The present invention has been made in consideration of such circumstances, and an object thereof is to provide an insulating substrate having excellent heat cycle characteristics at high temperatures in a state of a heat sink plate being soldered to the insulating substrate (namely, assuming a state of the insulating substrate being incorporated in a power module).

Means for Solving the Problems

The present inventors examined the factors that cause cracks to occur in the ceramic substrate. As a result, the present inventors speculated that what is called "brazing material layer leaching into solder," in which a solder component (for example, Sn) enters the brazing material layer with the heat-dissipation-side metal plate bonded thereto to form brittle compounds made of the solder component and a brazing material component (such as, for example, Ag or Cu) during a process of soldering a heat sink plate to an insulating substrate and in a subsequent heat cycle test, can be a factor of cracks. Therefore, the present invention was designed so that a solder resist prevents the brazing material layer leaching into solder (solder contact with the brazing material layer, wraparound), thereby avoiding the entry of the solder component into the brazing material layer.

According to the present invention, there is provided an insulating substrate, in which one principal surface of a heat-dissipation-side metal plate is bonded to one principal surface of a ceramic substrate via a brazing material layer provided therebetween and a solder resist portion is formed on at least one selected from a periphery of the other principal surface of the heat-dissipation-side metal plate, a side surface of the heat-dissipation-side metal plate, and a surface of the brazing material layer.

In this insulating substrate, one principal surface of a circuit-side metal plate is preferably bonded to the other principal surface of the ceramic substrate via a brazing material layer provided therebetween, the heat-dissipation-side metal plate is preferably a copper plate or a copper alloy plate, and the circuit-side metal plate is preferably a copper plate or a copper alloy plate. Further, the solder resist portion is preferably formed to surround a soldering region of the other principal surface of the heat-dissipation-side metal plate.

Further, according to the present invention, there is provided a manufacturing method of an insulating substrate being a manufacturing method of the insulating substrate, the method including: forming the solder resist portion by screen printing.

Further, there is provided a semiconductor module part (a heat sink plate attached insulating substrate), in which a heat sink plate is bonded to the other principal surface of the heat-dissipation-side metal plate of the insulating substrate with solder applied therebetween.

Further, there is provided a manufacturing method of a heat sink plate attached insulating substrate, the method including: bonding a heat sink plate to the other principal surface of the heat-dissipation-side metal plate of the insulating substrate by soldering.

Effect of the Invention

According to the present invention, the solder resist prevents solder from wrapping around the brazing material layer, and thereby, what is called "brazing material layer leaching into solder" no longer occurs and the occurrence of cracks inside the brazing material layer is avoided. This prevents stress concentration in the ceramic substrate at an inner portion relative to an end portion of the heat-dissipation-side metal plate. As a result, the occurrence of cracks in the ceramic substrate is also prevented, and it becomes possible to obtain an insulating substrate having excellent high-temperature heat cycle characteristics in a state of a heat sink plate being soldered to the insulating substrate.

BRIEF DESCRIPTION OF THE DRAWINGS

FIG. 2 is a cross-sectional view taken along the X-X line in

FIG. 1.

EMBODIMENTS FOR CARRYING OUT THE INVENTION

Figure 1:
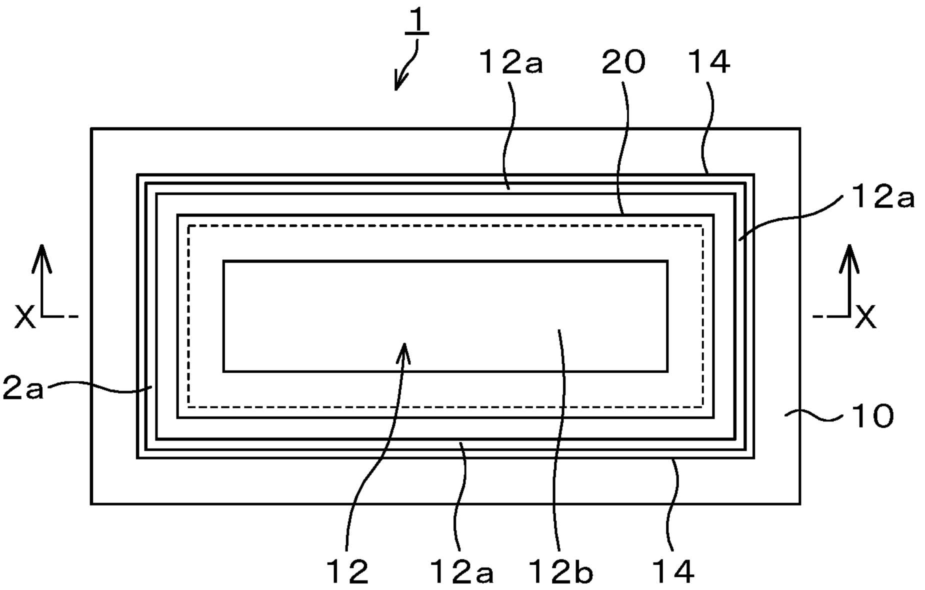
FIG. 1 is a plan view of an insulating substrate according to an embodiment of the present invention.

According to the present invention, there is provided an insulating substrate, in which one principal surface (surface) of a heat-dissipation-side metal plate is bonded to one principal surface (surface) of a ceramic substrate via a brazing material layer provided therebetween and a solder resist portion is formed on at least one selected from a periphery of the other principal surface (surface) of the heat-dissipation-side metal plate, a side surface of the heat-dissipation-side metal plate, and a surface of the brazing material layer.

Hereinafter, one example of an embodiment of the present invention will be explained with reference to the drawings. Incidentally, in this description and the drawings, elements having substantially the same functional configuration are denoted by the same reference numerals and symbols, so that redundant explanations will be omitted.

Figure 2:
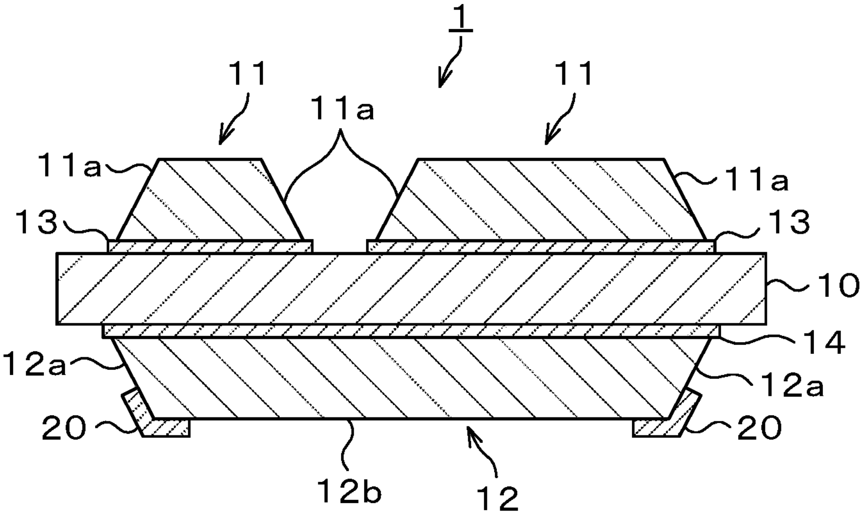

As illustrated in FIG. 1 and FIG. 2, an insulating substrate 1 according to an embodiment of the present invention is formed in a manner that a circuit-side metal plate 11 and a heat-dissipation-side metal plate 12 that are made of copper, a copper alloy, aluminum, an aluminum alloy, or the like are brazed to both surfaces of a ceramic substrate 10 containing AlN, $Al_2O_3$, $Si_3N_4$, or the like as a main component respectively with brazing material layers 13 and 14. Incidentally, FIG. 2 illustrates a state where one principal surface of the circuit-side metal plate 11 (a lower surface of the circuit-side metal plate 11 in FIG. 2) is brazed to the other principal surface of the ceramic substrate 10 (an upper surface of the ceramic substrate 10 in FIG. 2) with the brazing material layer 13 and one principal surface of the heat-dissipation-side metal plate 12 (an upper surface of the heat-dissipation-side metal plate 12 in FIG. 2) is brazed to one principal surface of the ceramic substrate 10 (a lower surface of the ceramic substrate 10 in FIG. 2) with the brazing material layer 14. Then, a semiconductor chip is soldered to the other principal surface of the circuit-side metal plate 11 (an upper surface of the circuit-side metal plate 11 in FIG. 2), and a heat sink plate (metal plate, base plate) made of copper, a copper alloy, aluminum, an aluminum alloy, or the like with excellent thermal conductivity is soldered to the other principal surface of the heat-dissipation-side metal plate 12 (a lower surface of the heat-dissipation-side metal plate 12 in FIG. 2) to fabricate a part used for a semiconductor power module, or the like. On the other principal surface of the heat-dissipation-side metal plate 12, the portion where the heat sink plate is soldered is referred to as a soldering region. The heat sink plate may have heat sink fins or heat sink pins formed on the opposite side of the ceramic substrate 10 (the surface to which the heat-dissipation-side metal plate is not bonded). Incidentally, the circuit-side metal plate 11 and the heat-dissipation-side metal plate 12 are preferably copper or a copper alloy.

The heat-dissipation-side metal plate 12 is formed on one principal surface of the ceramic substrate 10 excluding a region having a predetermined distance (for example, about 0.3 to 2.0 mm) from a creepage surface (an outer periphery) of the ceramic substrate 10, and has a rectangular shape in FIG. 1 and FIG. 2.

There is a growing need to improve the (high-temperature) heat cycle characteristics of the insulating substrate 1 in a state of the heat sink plate being soldered to the heat-dissipation-side metal plate 12 (namely, corresponding to a state where the insulating substrate is incorporated in a power module).

In the case where such an insulating substrate 1 is used as a semiconductor power module, when the above-described semiconductor chip is soldered to the circuit-side metal plate 11 or is soldered to the heat-dissipation-side metal plate 12, and further, when heat is generated repeatedly at a time when the semiconductor chip is energized, and at another event, due to a thermal stress generated by the difference between the thermal expansion coefficient between the ceramic substrate 10 and the circuit-side metal plate 11 and the thermal expansion coefficient between the ceramic substrate 10 and the heat-dissipation-side metal plate 12, and further due to the heat cycle load, at the boundary (bonding boundary) between the ceramic substrate 10 and the end portion of the circuit-side metal plate 11 and the boundary between the ceramic substrate 10 and the end portion of the heat-dissipation-side metal plate 12, stress concentration may occur on the surface of the ceramic substrate 10 to cause cracks. Therefore, measures have been taken to alleviate the stress concentration generated in the ceramic substrate 10 at the boundary between the ceramic substrate 10 and the end portion of the circuit-side metal plate 11 and the boundary between the ceramic substrate 10 and the end portion of the heat-dissipation-side metal plate 12 by forming side surfaces 11*a* and 12*a* of the circuit-side metal plate 11 and the heat-dissipation-side metal plate 12 into tapered surfaces, and further, making (protruding) the brazing material layers 13, 14 exposed from the end portions of the circuit-side metal plate 11 and the heat-dissipation-side metal plate 12 to form fillets, as illustrated in the insulating substrate 1 according to this embodiment, for example. Further, as described in Patent Document 5, there has been also known a technique to improve the heat cycle characteristics by forming steps at end portions of the copper plate.

However, as a result of the examination by the present inventors, they found out that in the semiconductor power module in which the semiconductor chip and the heat sink plate are mounted by soldering, cracks may occur in the surface of the ceramic substrate 10 at an inner portion (bonding region) rather than at the end portion of the heat-dissipation-side metal plate 12. The present inventors examined the factors that cause cracks to occur in the ceramic substrate 10 (in the plate thickness direction of the ceramic substrate 10) at an inner portion relative to the end portion of the heat-dissipation-side metal plate 12. As a result, the present inventors found out that Sn in the solder enters (diffuses into) the brazing material layer 14 when the heat sink plate is soldered to the heat-dissipation-side metal plate 12, and then, what is called "the brazing material layer 14 leaching into solder," occurs, resulting in that Sn in the solder and elements such as Ag and Cu contained in the brazing material layer 14 form brittle compounds. Then, it was observed that cracks have occurred (in a direction substantially parallel to the bonding interface) inside the brazing material layer 14 embrittled due to such "the brazing material layer 14 leaching into solder" and the formation of compounds.

Furthermore, by cross-section analysis of the insulating substrate 1, the occurrence of a crack was observed in the thickness direction from one principal surface (surface) of the ceramic substrate 10 at an inner portion in the brazing material layer relative to the end portion of the heat-dissipation-side metal plate 12 and at a tip portion of the crack in the brazing material layer 14. Further, when a stress analysis was performed based on a simulation, it was found out that when the aforementioned crack is present in the brazing material layer, stress concentration occurs on the surface of the ceramic substrate 10 at the tip portion of the crack. It was found out that this causes a crack to occur in one principal surface of the ceramic substrate 10 positioned on the inner side relative to the end portion of the heat-dissipation-side metal plate 12. Thus, in the present invention, it was found out that by using solder resist, wraparound (diffusion) of the solder to (into) the brazing material layer 14 is prevented, and thereby it is possible to avoid the entry (diffusion) of Sn or the like, which is the solder component, into the brazing material layer 14, inhibit the occurrence of stress concentration, and prevent the occurrence of cracks, that is, it is possible to obtain the insulating substrate 1 having excellent heat cycle characteristics even in a state of the heat sink plate being soldered to the insulating substrate 1.

Further, the crack in the aforementioned brazing material layer is prevented, thereby making it possible to inhibit deterioration of heat release ability of the insulating substrate.

In recent years, the operating temperature of power modules has tended to increase, and further, the uses of high-temperature solder with a large content of Sn and lead-free solder have been increasing, and it is considered that the occurrence of cracks in the ceramic substrate 10 caused by the aforementioned brazing material leaching increases. However, the insulating substrate in the present invention is particularly suitable for a semiconductor module in which the heat-dissipation-side metal plate 12 and the heat sink plate are soldered using such a solder containing a large amount of Sn.

In the insulating substrate 1 according to the embodiment of the present invention illustrated in FIG. 1 and FIG. 2, a solder resist portion 20 is provided on a periphery of the other principal surface and the side surface of the heat-dissipation-side metal plate 12, and thereby, the solder to be soldered to the heat-dissipation-side metal plate 12 is prevented from wrapping around (coming into contact with) the brazing material layer 14 (exposed between one principal surface of the ceramic substrate 10 and one principal surface of the heat-dissipation-side metal plate 12). That is, the center portion of the surface of the other principal surface of the heat-dissipation-side metal plate 12 (the center of the lower surface of the heat-dissipation-side metal plate 12 in FIG. 2) is a soldering region 12*b* where a heat sink plate 30 (to be described below) is soldered, and the solder resist portion 20 is arranged to surround this soldering region 12*b*. In other words, in the center of the surface of the heat-dissipation-side metal plate 12, the soldering region 12*b* is formed to which the heat sink plate 30 is soldered, and the solder resist portion 20 is provided (defined) to surround the soldering region 12*b*. Then, the soldering region 12*b* and the brazing material layer 14 are separated by the solder resist portion 20.

Incidentally, the solder resist portion 20 can be formed appropriately by, for example, applying a solder resist containing, as a main component, a well-known resin such as an alkali development-type solder resist, a UV curable-type solder resist, or a thermosetting solder resist to surround the soldering region 12*b* by a means such as a screen printing method, and curing it by a means such as exposure or heating. Incidentally, if plating such as Ni plating is applied to the entire surface of the heat-dissipation-side metal plate and the entire surface of the brazing material, the "brazing material layer leaching into solder" can be prevented, but the thermal shock resistance of the insulating substrate alone is not sufficient.

Figure 3:
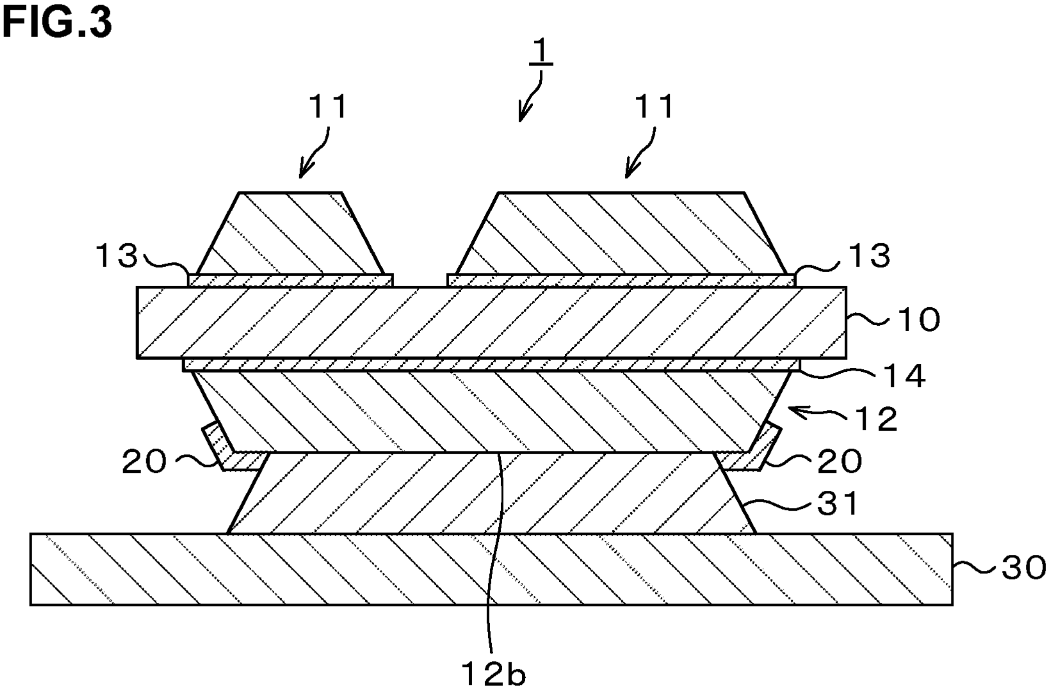
FIG. 3 is a cross-sectional view of the insulating substrate with a heat sink plate soldered to a heat-dissipation-side metal plate.

FIG. 3 illustrates a state where the heat sink plate 30 is soldered to the heat-dissipation-side metal plate 12 in the insulating substrate 1 formed as above. The heat sink plate 30 is formed of a base material having excellent thermal conductivity such as Cu or Al, and the heat sink plate 30 is attached to the insulating substrate 1 by soldering the heat sink plate 30 to the soldering region 12*b* of the heat-dissipation-side metal plate 12 with solder 31.

In the insulating substrate 1 according to the embodiment of the present invention, in the case where the heat sink plate 30 is soldered to the heat-dissipation-side metal plate 12 with the solder 31 as above, the solder 31 soldered to the soldering region 12*b* can avoid wrapping around to the brazing material layer 14 without being protruded from the region surrounded by the solder resist portion 20 (soldering region 12*b*) (without wetting and spreading). The solder 31 does not come into contact with the brazing material layer 14, and thus, the entry (diffusion) of Sn or the like being the solder component into the brazing material layer 14 is prevented and what is called "the brazing material layer 14 leaching into solder" does not occur. As a result, the occurrence of cracks inside the brazing material layer 14 is avoided. Further, since the occurrence of cracks inside the brazing material layer 14 is avoided, the occurrence of stress concentration in the ceramic substrate 10 at an inner portion relative to the end portion of the heat-dissipation-side metal plate 12 is prevented. As a result, the occurrence of cracks is avoided even in the ceramic substrate 10, and the insulating substrate 1 having excellent heat cycle characteristics can be obtained.

Figure 4:
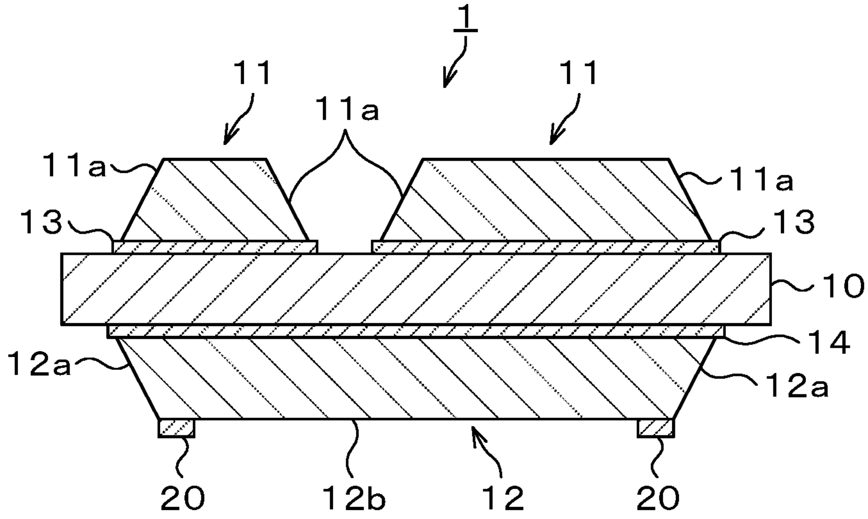
FIG. 4 is a cross-sectional view of an insulating substrate according to another embodiment of the present invention.
Figure 5:
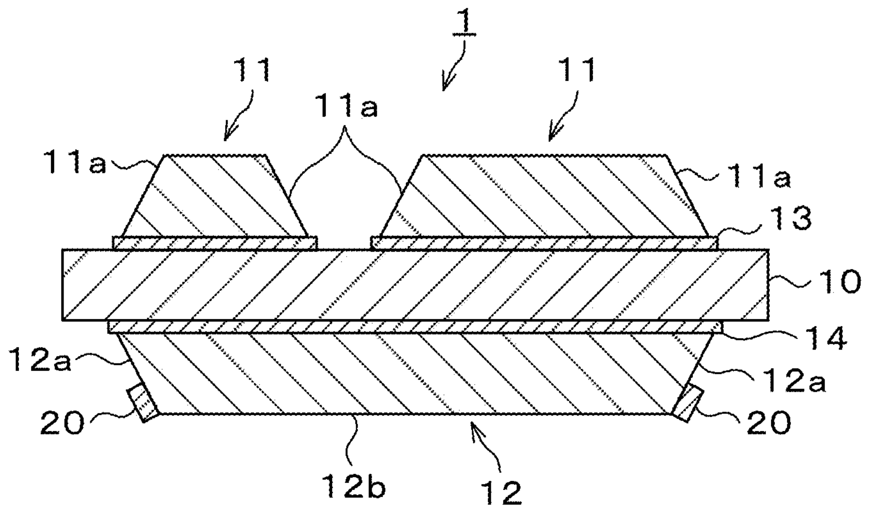
FIG. 5 is a cross-sectional view of an insulating substrate according to another embodiment of the present invention.
Figure 6:
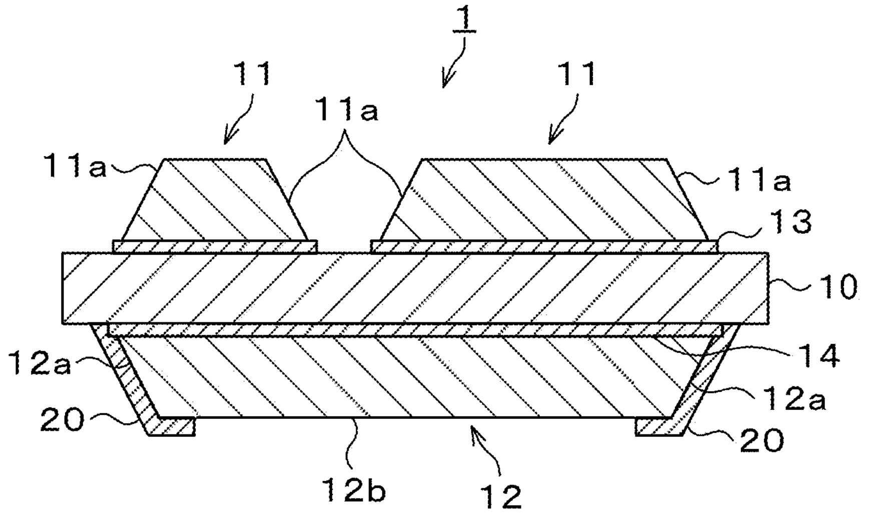
FIG. 6 is a cross-sectional view of an insulating substrate according to another embodiment of the present invention.

Incidentally, FIG. 1 to FIG. 3 each illustrate the example where the solder resist portion 20 is provided to cover the side surface 12*a* of the heat-dissipation-side metal plate 12 and the surface of the heat-dissipation-side metal plate 12 (the periphery of the lower surface of the heat-dissipation-side metal plate 12 in FIG. 2 and FIG. 3) (the periphery of the other principal surface of the heat-dissipation-side metal plate 12), but as illustrated in FIG. 4, the solder resist portion 20 may be provided only on the surface of the heat-dissipation-side metal plate 12 (the periphery of the lower surface of the heat-dissipation-side metal plate 12 in FIG. 4) (the periphery of the other principal surface of the heat-dissipation-side metal plate 12), or as illustrated in FIG. 5, the solder resist portion 20 may be provided only on the side surface 12*a* of the heat-dissipation-side metal plate 12. Further, as illustrated in FIG. 6, the solder resist portion 20 may be provided to cover the end portion of the brazing material layer 14 exposed from the end portion of the heat-dissipation-side metal plate 12 and the side surface 12*a* and the periphery of the other principal surface of the heat-dissipation-side metal plate 12. Further, the solder resist portion may be formed only on the brazing material layer 14 or may be formed on the brazing material layer 14 and the side surface 12*a* of the heat-dissipation-side metal plate 12.

In the foregoing, the embodiment of the present invention has been described, but the present invention is not limited to such an example. It is apparent that those skilled in the art are able to devise various variation or modification examples within the scope of the technical spirit described in the claims, and it should be understood that such examples belong to the technical scope of the present invention as a matter of course.

For example, in the present invention, the solder resist may be any substance as long as it prevents wetting and spreading of the solder. For example, there may be employed a method of oxidizing a part of the heat-dissipation-side metal plate 12 by laser irradiation, chemical treatment, or the like to form a metal oxide film on the surface. Further, the solder resist portion may be arranged so that the solder does not come into direct contact with the brazing material layer of the insulating substrate. For example, as described above, even if the brazing material layer portion is not covered with the solder resist portion, it is sufficient if the solder is prevented from coming into contact with the brazing material layer.

Incidentally, from the viewpoint of manufacturability and cost when forming the solder resist, it is preferable to use a solder resist paste containing a resin. Further, the solder resist is preferably formed also on the side surface of the heat-dissipation-side metal plate.

EXAMPLE

Example 1

As the ceramic substrate, an aluminum nitride substrate having a size of 46 mm×48 mm×0.4 mm was used. An active-metal-containing brazing material in the form of a paste, which was made by adding 83 mass % of silver, 10 mass % of copper, 5 mass % of tin, and 2 mass % of titanium (serving as the active metal component) (Ag:Cu:Sn:Ti=83:10:5:2) to a vehicle and kneading them, was screen-printed on almost the entire surfaces (a region of 45 mm×47 mm) of one principal surface and the other principal surface (front and back surfaces) of the aforementioned ceramic substrate to have a thickness of 10 μm, to then form respective brazing material layers, and an oxygen-free copper plate having a size of 46 mm×48 mm×0.3 mm was arranged on each of one principal surface and the other principal surface of the aforementioned ceramic substrate so as to cover the entire surface of the brazing material layer formed on the aluminum nitride substrate, and was heated to 850° C. in a vacuum and then cooled, and thereby, the copper plates were bonded to the both surfaces of the aluminum nitride substrate.

Then, an ultraviolet curable alkaline-strippable etching resist having a predetermined circuit pattern shape was applied to the surface of the copper plate serving as a circuit side by screen printing and an ultraviolet curable alkaline-strippable etching resist having a rectangular shape of 44 mm×46 mm was applied to the surface of the center portion of the copper plate serving as a heat dissipation side by screen printing (where the resist was not applied in the range of 1 mm from the creepage surface of each side of the copper plate to the inner side). After the etching resists were irradiated with ultraviolet rays to be cured, the unnecessary portions of the copper plates were etched with an etching solution made of copper chloride, hydrochloric acid, and water as the balance, the etching resists were removed with an aqueous sodium hydroxide solution, and a circuit-side copper plate (copper circuit) and a heat-dissipation-side copper plate were formed.

Then, a fabricated product was immersed in dilute sulfuric acid for 20 seconds to be pickled, and immersed in an aqueous chelate solution containing 1.6 mass % of EDTA·4Na, 3 mass % of ammonia water (ammonia water containing 28 mass % of ammonia), and 5 mass % of hydrogen peroxide solution (hydrogen peroxide solution containing 35 mass % of hydrogen peroxide) at 20° C. for 20 minutes, and then, immersed in an aqueous chelate solution containing 2 mass % of ethylenetriaminepentaacetic acid (DTPA)·5Na and 5 mass % of hydrogen peroxide solution (hydrogen peroxide solution containing 35 mass % of hydrogen peroxide) at 20° C. for 52 minutes, and thereby the unnecessary portions of the brazing material layers (active metal containing brazing materials) remaining around the circuit-side copper plate and the heat-dissipation-side copper plate on the surfaces of the aluminum nitride substrate were removed to obtain an intermediate product of an insulating substrate.

Then, the aforementioned intermediate product was immersed in a chemical polishing solution made of 14 mass % of sulfuric acid, 3.2 mass % of hydrogen peroxide, and water as the balance at 45° C. for 5 minutes to remove the unnecessary portions of the circuit-side copper plate and the heat-dissipation-side copper plate by chemical polishing to cause the brazing material layers (active metal containing brazing materials) to protrude from side surface portions of the circuit-side copper plate and the heat-dissipation-side copper plate. A process of forming a predetermined copper pattern was completed to obtain the insulating substrate.

Then, an ultraviolet curable solder resist was applied by screen printing to the outer periphery of the surface (bottom surface (the other principal surface)) of the heat-dissipation-side copper plate in the range of 0.05 mm in width and the side surface portion of the heat-dissipation-side copper plate, the solder resists were irradiated with ultraviolet rays to be cured, and thereby a solder resist portion (solder flow prevention region) having a thickness of 15 μm was formed on the outer peripheral portion of the other principal surface and the side surface of the heat-dissipation-side copper plate to fabricate the insulating substrate. As the shape of the solder resist portion, as illustrated in FIGS. 1 to 3, the example where the solder resist portion covers the side surface of the heat-dissipation-side copper plate and the periphery of the other principal surface of the heat-dissipation-side copper plate was employed. Incidentally, the solder resist was applied to the side surface of the heat-dissipation-side copper plate by increasing the printing pressure (squeegee pressure) in the above-described screen printing using a screen plate.

In the insulating substrate fabricated in this manner, the following base plate soldering test was conducted to evaluate the presence or absence of brazing material leaching of the brazing material layer. First, a Sn-5.0Sb solder paste containing flux (manufactured by SENJU METAL INDUSTRY CO., LTD., M10) was applied to the surface of a heat sink plate (copper base plate) having a size of 120 mm×60 mm×3 mm to have a thickness of 300 μm in the same shape as the outer shape of the insulating substrate (a rectangle of 46 mm×48 mm) using a metal mask.

Then, the previously-described heat-dissipation-side metal plate of the insulating substrate was mounted on this solder paste so that the other principal surface thereof was in contact with the solder paste, and the temperature was raised to 270° C. in an $N_2$ atmosphere, and then, while maintaining the temperature to 270° C., evacuation was performed for 3 minutes and then the temperature was lowered, and thereby the insulating substrate was soldered to the heat sink plate (copper base).

Of the base plate attached insulating substrate obtained as above, a cross-sectional observation sample was prepared, and element mapping was performed on the sample by an optical microscope and a scanning electron microscope (SEM/EDS) equipped with an energy dispersive X-ray analyzer to confirm the presence or absence of contact between the brazing material layer and the solder and the presence or absence of occurrence of brazing material leaching. As a result, in the insulating substrate fabricated in this example, it was confirmed from an optical microscope image that the solder resist portion hinders the solder used for soldering the heat sink plate from wetting and spreading, and the contact between the solder and the brazing material layer of the insulating substrate is prevented. Further, it was confirmed from the element mapping by SEM/EDS that Sn or the like, being the solder component, does not diffuse into the brazing material layer side and no brittle Cu—Sn compounds are formed in the brazing material layer of the insulating substrate (the brazing material leaching does not occur).

Example 2

An insulating substrate was obtained by the same method as in Example 1 except that the range of the solder resist to be applied to the heat-dissipation-side metal plate was set to the range of 0.05 mm in width in the outer periphery of the surface (the other principal surface) of the heat-dissipation-side metal plate and the solder resist portion was not formed on the side surface of the heat-dissipation-side metal plate. As the shape of the solder resist portion, as illustrated in FIG. 4, the example where the solder resist portion was formed only on the surface (the other principal surface) of the heat-dissipation-side metal plate was employed.

The base plate soldering test was conducted on this insulating substrate by the same method as in Example 1. In the insulating substrate fabricated in this example, it was confirmed from an optical microscope image that the solder resist portion hinders the solder used for soldering the base plate from wetting and spreading, and the contact between the solder and the brazing material layer of the insulating substrate is prevented. Further, it was confirmed from the element mapping by SEM/EDS that Sn or the like, being the solder component, does not diffuse into the brazing material layer side in the brazing material layer of the insulating substrate (the brazing material leaching does not occur).

Comparative Example 1

An insulating substrate was obtained by the same method as in Example 1 except that the solder resist was not applied to the heat-dissipation-side metal plate.

The base plate soldering test was conducted on this insulating substrate by the same method as in Example 1. In the insulating substrate fabricated in this comparative example, it was confirmed from an optical microscope image that the solder used for soldering the base plate is wet and spreads to the side surface of the heat-dissipation-side copper plate and the brazing material layer of the insulating substrate and the solder are in contact with each other. Further, it was confirmed from the element mapping by SEM/EDS that Sn or the like, being the solder component, diffuses into the brazing material layer side and brittle Cu—Sn compounds are formed in the brazing material layer of the insulating substrate (the brazing material leaching occurs).

INDUSTRIAL APPLICABILITY

The present invention can be used for an insulating substrate to be used for a semiconductor power module, and the like, for example.

EXPLANATION OF CODES

1 insulating substrate
10 ceramic substrate
11 circuit-side metal plate (copper circuit plate)
12 heat-dissipation-side metal plate
13, 14 brazing material layer
11*a*, 12*a* side surface

12*b* soldering region
20 solder resist portion
30 heat sink plate (copper plate)
31 solder

What is claimed is:

1. An insulating substrate, wherein one principal surface of a heat-dissipation-side metal plate is bonded to one principal surface of a ceramic substrate via a brazing material layer provided therebetween, the brazing material layer protrudes past an end portion of the heat-dissipation-side metal plate in a direction parallel to the one principal surface of the heat-dissipation-side metal plate, and a solder resist portion having direct contact with at least one selected from a periphery of another principal surface of the heat-dissipation-side metal plate, a side surface of the heat-dissipation-side metal plate, and a surface, on the side of the heat-dissipation-side metal plate, of the brazing material layer protruding from the end portion of the heat-dissipation-side metal plate.

2. The insulating substrate according to claim 1, wherein one principal surface of a circuit-side metal plate is bonded to the another principal surface of the ceramic substrate via another brazing material layer provided therebetween.

3. The insulating substrate according to claim 1, wherein the circuit-side metal plate is a copper plate or a copper alloy plate.

4. The insulating substrate according to claim 1, wherein the heat-dissipation-side metal plate is a copper plate or a copper alloy plate.

5. The insulating substrate according to claim 1, wherein the solder resist portion is formed to surround a soldering region of the another principal surface of the heat-dissipation-side metal plate.

6. A manufacturing method of an insulating substrate being a manufacturing method of the insulating substrate according to claim 1, the method comprising:

forming the solder resist portion by screen printing.

7. A semiconductor module part, wherein a heat sink plate is bonded to the another principal surface of the heat-dissipation-side metal plate of the insulating substrate according to claim 1 with solder applied therebetween.

8. A manufacturing method of a heat sink plate attached insulating substrate, the method comprising:

bonding a heat sink plate to the another principal surface of the heat-dissipation-side metal plate of the insulating substrate according to claim 1 by soldering.

9. The insulating substrate according to claim 1, wherein the solder resist portion is formed only on the another principal surface of the heat-dissipation-side metal plate.

* * * * *